(12) United States Patent
Hirigoyen et al.

(10) Patent No.: US 9,099,580 B2
(45) Date of Patent: Aug. 4, 2015

(54) ELEMENTARY IMAGE ACQUISITION OR DISPLAY DEVICE

(75) Inventors: Flavien Hirigoyen, Grenoble (FR); Axel Crocherie, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 220 days.

(21) Appl. No.: 13/449,454

(22) Filed: Apr. 18, 2012

(65) Prior Publication Data

US 2012/0262635 A1    Oct. 18, 2012

(30) Foreign Application Priority Data

Apr. 18, 2011   (FR) ...................... 11 53347

(51) Int. Cl.
| | |
|---|---|
| G02F 1/1335 | (2006.01) |
| H01L 31/0232 | (2014.01) |
| G02B 3/00 | (2006.01) |
| H01L 27/146 | (2006.01) |
| G02F 1/1362 | (2006.01) |

(52) U.S. Cl.
CPC ........ *H01L 31/02327* (2013.01); *G02B 3/0043* (2013.01); *G02F 1/133526* (2013.01); *G02F 1/136277* (2013.01); *H01L 27/14627* (2013.01)

(58) Field of Classification Search
CPC .................................................. H01L 27/14627
USPC ............................................... 257/432; 349/5
See application file for complete search history.

(56) References Cited

U.S. PATENT DOCUMENTS

| | | | | |
|---|---|---|---|---|
| 7,068,432 | B2 * | 6/2006 | Boettiger et al. | 359/619 |
| 7,755,154 | B2 * | 7/2010 | Lee | 257/431 |
| 7,916,204 | B2 * | 3/2011 | Wells et al. | 348/340 |
| 2004/0257460 | A1 | 12/2004 | Kuriyama | |
| 2006/0289956 | A1 | 12/2006 | Boettiger et al. | |
| 2007/0090419 | A1 * | 4/2007 | Lee | 257/290 |
| 2008/0151378 | A1 | 6/2008 | Kim | |
| 2009/0283807 | A1 * | 11/2009 | Adkisson et al. | 257/292 |
| 2010/0289101 | A1 * | 11/2010 | Vaillant et al. | 257/432 |
| 2011/0147869 | A1 * | 6/2011 | Lazarov et al. | 257/432 |

FOREIGN PATENT DOCUMENTS

WO    WO 2006066081 A1    6/2006

OTHER PUBLICATIONS

French Search Report and Written Opinion dated Nov. 15, 2011from corresponding French Application No. 11/53347.

* cited by examiner

*Primary Examiner* — Matthew W Such
*Assistant Examiner* — Warren H Kilpatrick
(74) *Attorney, Agent, or Firm* — Seed IP Law Group PLLC

(57) ABSTRACT

An elementary image acquisition or display device, including a focusing structure with microlenses, each microlens being shaped to focus incident light beams towards a substrate while avoiding intermediate conductive tracks and vias.

28 Claims, 4 Drawing Sheets

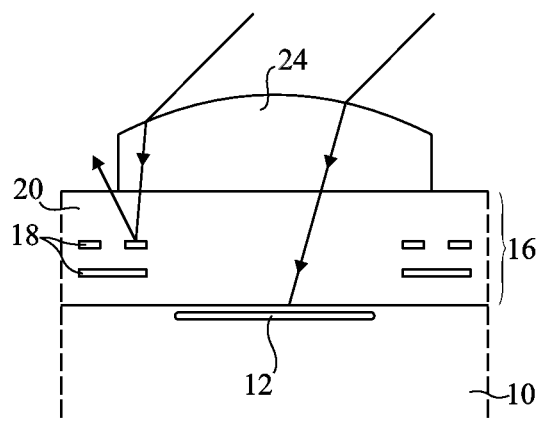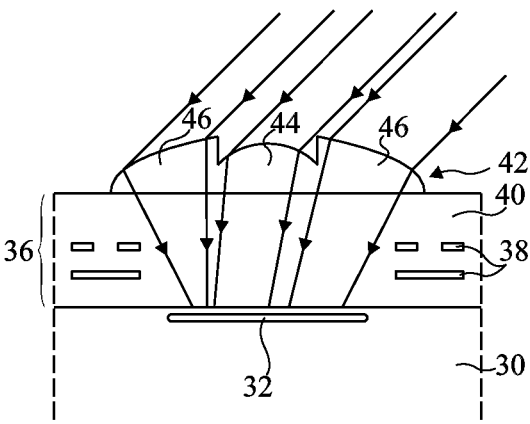
Fig 6A                    Fig 6B
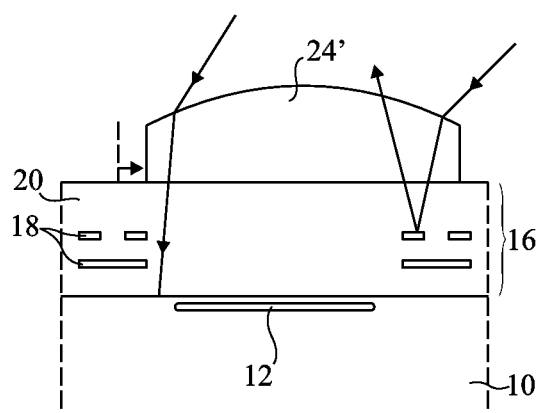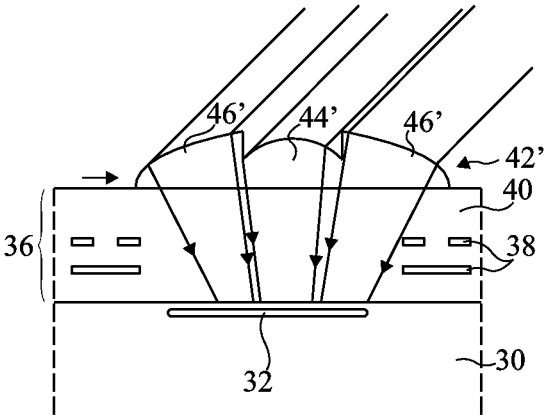
Fig 7A                    Fig 7B
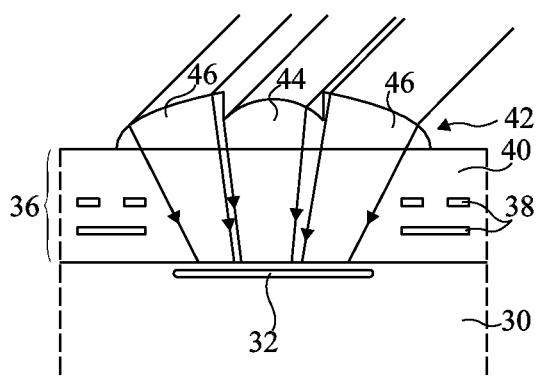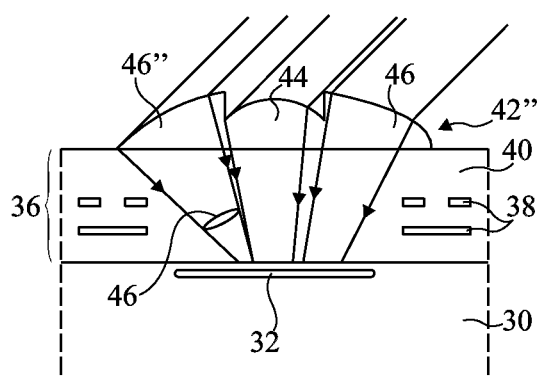
Fig 8A                    Fig 8B

ELEMENTARY IMAGE ACQUISITION OR DISPLAY DEVICE

CROSS REFERENCE TO RELATED APPLICATIONS

This application claims the priority benefit of French patent application number 11/53347, filed on Apr. 18, 2011, entitled ELEMENTARY IMAGE ACQUISITION OR DISPLAY DEVICE, which is hereby incorporated by reference to the maximum extent allowable by law.

BACKGROUND

1. Technical Field

Embodiments relate to an elementary image acquisition or display device, capable of being used in integrated image sensors or liquid crystal display projectors.

2. Discussion of the Related Art

FIG. 1 illustrates a front-side illuminated image sensor, comprising a pixel array formed at the surface of a semiconductor substrate 10.

Each pixel P1, P2, P3 comprises an area where photogenerated charges 12 are collected and active elements for transferring the collected charges 14 to an adapted electronic circuit. An interconnection stack 16, comprising conductive tracks and vias 18 separated by an insulating material 20, is formed above substrate 10 to connect the elements for transferring the collected charges to the rest of the electronic circuit of the image sensor. Preferably, the conductive tracks and vias extend in front of the periphery of the collection areas to avoid getting in the way of the light rays. Each pixel is insulated from the neighboring pixels by buried insulating regions 22 formed in substrate 10.

To improve the detection of incident light beams, it may be provided to direct these beams towards collection areas 12 by means of a microlens 24 defined in front of each of the pixels, on interconnection stack 16. This enables limiting parasitic reflections of incident photons on the conductive regions of the interconnection stack.

FIG. 2 illustrates a disadvantage associated with this type of structure.

In FIG. 2, the pixel has, at the surface of substrate 10, dimensions greater than the thickness of interconnection stack 16. A microlens 24, formed at the pixel surface, has a radius of curvature which is not sufficient to focus all incident light beams towards the center of the photodetection area. As a result, beams 26 reaching the periphery of the microlens are focused towards conductive tracks of the interconnection stack, instead of being focused towards substrate 10. Beams 26 are reflected by the conductive tracks of the stack and are not collected, which adversely affects the image sensor detection.

To solve this problem, it could be envisaged to form a thicker microlens, which would thus be more rounded. However, microlens manufacturing methods have their limits, thus imposing a maximum lens thickness, which is not adapted for large pixels such as the pixel of FIG. 2. Further, very thick microlenses tend to cause spherical aberrations and thus to adversely affect the detection.

Conventional microlens structures associated with image sensors are thus not ideal for pixels having dimensions (the "pitch") close to (of the same order of magnitude) or greater than the thickness of the interconnection stack formed at the substrate surface. More specifically, such microlens structures become unsuitable when the pixel size becomes greater than 0.8 times the thickness of the interconnection stack (for example, for pixels having substrate surface area dimensions greater than 3 μm).

For example, for an interconnection stack thickness on the order of 3 μm, such microlens structures become unsuitable for pixels with pitches greater than 2.4 μm.

There thus is a need for a focusing structure adapted to large-pitch pixels such as discussed hereabove.

SUMMARY

An embodiment provides an elementary image acquisition or display device comprising a focusing element adapted to any elementary device shape.

More specifically, an embodiment provides an image sensor or a liquid crystal display projector formed of such elementary devices.

Thus, an embodiment provides an elementary image acquisition or display device, comprising a focusing structure with microlenses, each microlens being shaped to focus incident light beams towards a substrate while avoiding intermediate conductive tracks and vias.

According to an embodiment, the focusing structure comprises an array of at least nine microlenses.

According to an embodiment, the focusing structure comprises a first portion in which microlenses are spherical and symmetrical and a second portion in which microlenses are curved.

According to an embodiment, the intermediate conductive tracks and vias are separated by an insulating material to form an interconnection stack, the microlenses being formed at the surface of the interconnection stack.

An embodiment further provides an image sensor comprising at least one elementary image acquisition device such as discussed hereabove, wherein the microlenses of the focusing structure are provided to focus incident light beams towards an area for collecting photogenerated charges defined in the substrate.

According to an embodiment, each elementary image acquisition device has, at the surface of the substrate, dimensions greater than 0.8 times the interval separating the microlenses from the substrate.

According to an embodiment, the image sensor is formed of an array of elementary devices wherein the different focusing structures have different shapes.

According to an embodiment, the shape of the microlenses of the focusing elements varies according to the color detected by the collection areas.

According to an embodiment, the sensor comprises first elementary image acquisition devices in which the focusing structure is centered above the photogenerated charge collection areas and second elementary image acquisition devices in which the focusing structure is off-centered above the photogenerated charge collection areas.

An embodiment further provides a liquid crystal display projector comprising at least one elementary image display device such as discussed hereabove, further comprising, above the substrate and opposite to the microlenses, a liquid crystal layer, the microlenses of the focusing structure being provided to focus incident light beams towards the liquid crystal layer.

The foregoing and other objects, features, and advantages will be discussed in detail in the following non-limiting description of specific embodiments in connection with the accompanying drawings.

BRIEF DESCRIPTION OF THE DRAWINGS

FIGS. 6A and 6B illustrate a comparison between known devices and an image sensor according to an embodiment in the case of an illumination oblique with respect to the sensor surface;

FIGS. 7A and 7B illustrate a comparison between a known device and a device according to an alternative embodiment;

FIGS. 8A, 8B, and 8C illustrate a comparison between elementary image sensor devices according to alternative embodiments.

For clarity, the same elements have been designated with the same reference numerals in the different drawings and, further, as usual in the representation of image sensors, the various drawings are not to scale.

DETAILED DESCRIPTION

Figure 1:
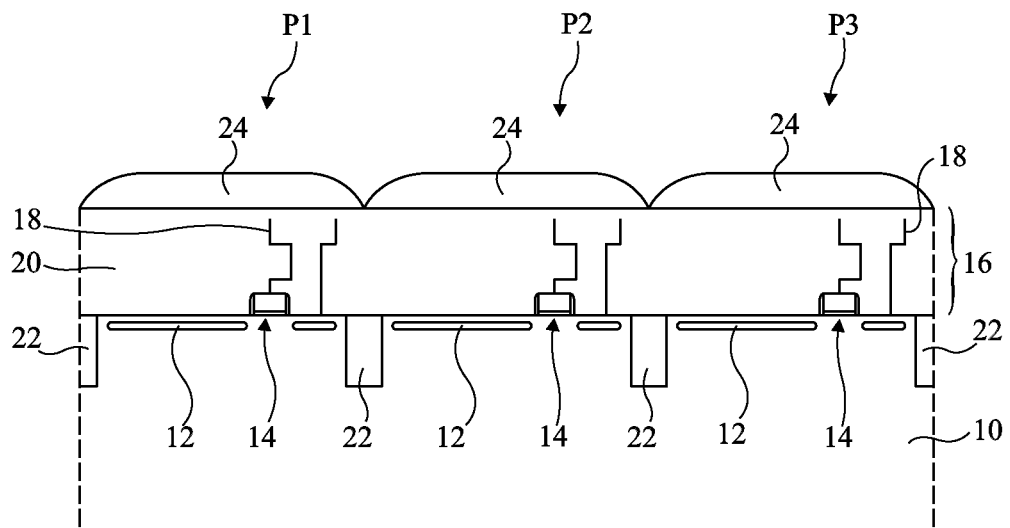
FIG. 1, previously described, illustrates a front-side illuminated image sensor.
Figure 2:
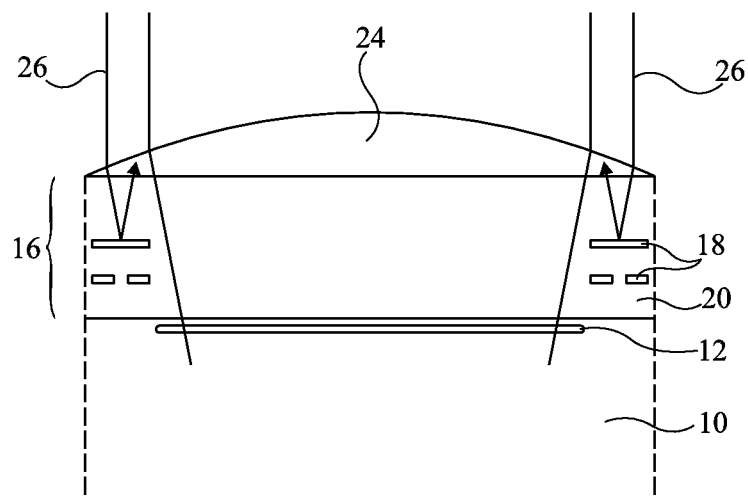
FIG. 2, previously described, illustrates the issues raised by conventional microlens structures in the case of image sensors of large dimensions.
Figure 3:
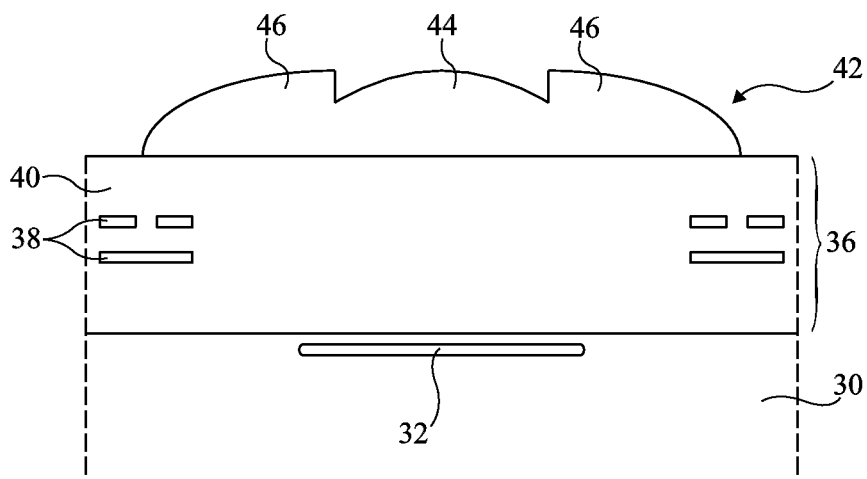
FIG. 3 illustrates an example of an image sensor pixel.

FIG. 3 illustrates an elementary image acquisition device according to an embodiment, used to form an elementary front-side illuminated image sensor structure.

The device of FIG. 3 comprises a substrate 30 in which is formed a photogenerated charge collection area 32. At the surface of substrate 30 are provided active elements for transferring the collected charges, for example, MOS transistors (not shown), topped with an interconnection stack 36 comprising conductive tracks and vias 38 (schematically shown) separated by an insulating material 40. Conductive tracks and vias 38 are formed in front of the periphery of photogenerated charge collection area 32.

At the surface of interconnection stack 36 is provided a structure 42 for focusing light beams. According to an embodiment, structure 42 is formed of an assembly of microlenses 44, 46 of different shapes, each microlens 44, 46 being provided to create an incident beam focusing cone towards photogenerated charge collection area 32, independently from the neighboring microlenses.

In the example of FIG. 3, focusing structure 42 comprises a central microlens 44 surrounded with eight microlenses 46. Each microlens 44, 46 is oriented to focus incident beams towards collection area 32.

Figure 4:
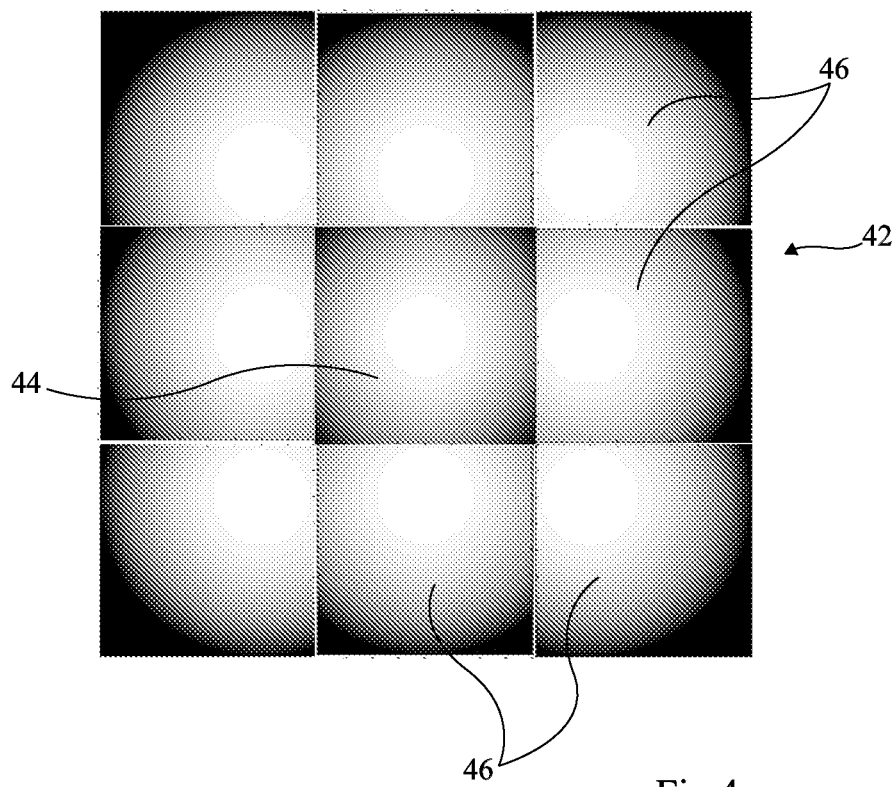
FIG. 4 is a top view illustrating, in grey levels, the thickness variation of a pixel focusing system.

FIG. 4 is a top view of a focusing structure 42 comprising nine microlenses in which is shown, in grey levels, the thickness of microlenses 44 and 46. In this drawing, light regions correspond to thick regions of the microlenses and dark regions correspond to thin regions of the microlenses.

In this example, central microlens 44 is a conventional microlens having a symmetrical spherical shape at the surface of the interconnection stack. Peripheral microlenses 46 are provided with a slanted shape so that they focus beams of normal incidence towards the center of focusing structure 42.

To obtain a structure such as that in FIGS. 3 and 4, conventional microlenses manufacturing techniques may be used, for example, techniques of etching through a grey level mask, each grey level corresponding to an etching thickness of the lens. Such techniques provide an etch resolution on the order of a few nanometers, compatible with the forming of sensors such as discussed herein comprising a focusing structure formed of an assembly of microlenses 44 and 46.

It should be noted that other microlens-forming techniques having accurately adjustable shapes may also be used to obtain the above-discussed focusing structure with several microlenses.

According to the desired application, a smaller or larger number of microlenses may be provided in the focusing structure, for example, according to the positioning of the conductive tracks and vias in interconnection stack 36.

FIGS. 5A and 5B, 6A and 6B, and 7A and 7B illustrate comparisons between known structures with one microlens and the focusing structure of FIGS. 3 and 4, as well as alternative embodiments, under various illuminations.

Figure 5A:
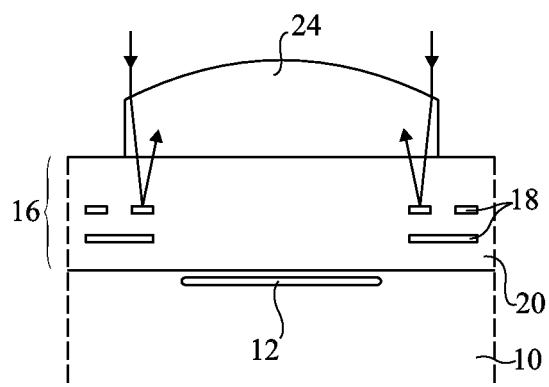
FIGS. 5A and 5B illustrate a comparison between known devices and an image sensor according to an embodiment in the case of an illumination normal to the sensor surface.
Figure 5B:
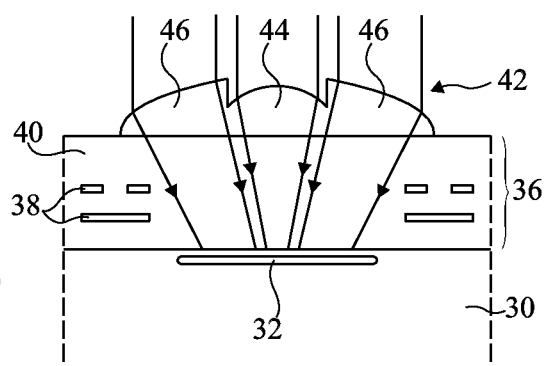

In the case of FIGS. 5A and 5B, the illumination is normal to the surface of substrate 30.

In this case, as seen previously, a conventional device comprising a single microlens at the pixel surface (FIG. 5A) has the disadvantage that, for beams reaching the pixel periphery, such beams are directed by the microlens towards conductive tracks of the interconnection stack and reflect on these tracks. In the device provided herein (FIG. 5B), the focusing cones created by the microlenses all converge towards photodetection area 32, which ensures that beams reaching the device periphery are directed away from conductive tracks 38 of interconnection stack 36 and are properly detected.

In the case of FIGS. 6A and 6B, the illumination is oblique with respect to the surface of substrate 30. With a conventional device with a single microlens (FIG. 6A), beams reaching a side of the microlens are focused towards conductive tracks of the interconnection stack, or even towards photogenerated charge collection areas of neighboring pixels (crosstalk phenomenon).

In the case of FIG. 6B, the oblique incident beams are properly redirected by a peripheral microlens 46 towards photogenerated charge collection area 32.

According to an alternative embodiment, the focusing structures associated with the different pixels may vary according to their positioning at the surface of the image sensor, according to the direction of illumination of the main device, or again according to the color of the associated pixel in the case of color pixels.

FIG. 7A illustrates, in cross-section view, a variation of a known focusing structure, wherein a microlens 24' is formed in front of a pixel, but off-centered with respect to the center of charge collection area 12 of this pixel.

As compared with microlens structure 24 of FIG. 6A, the positioning of microlens 24' implies that, under an oblique illumination, a beam reaching the microlens periphery and which is, in the case of FIG. 6A, focused towards a conductive track, is here properly deviated towards charge collection region 12. However, on the other side of the pixel, a beam reaching the periphery of the microlens is focused towards a conductive region 18 and is reflected by said region. Thus, the structure of FIG. 7A does not improve the detection of beams having an oblique incidence with respect to the structure of FIG. 6B.

FIG. 7B illustrates a variation of the structure of FIG. 6B in which a pixel is topped with a focusing structure 42', off-centered above the pixel with respect to focusing structure 42 of the pixel of FIG. 6B. Conversely to the case of FIG. 7A, the specific shape of the focusing structure of FIG. 7B enables avoiding parasitic reflections on conductive tracks of the interconnection stack, the focusing cones of the microlenses being directed towards collection area 32.

A focusing structure such as that shown in FIG. 7B may be advantageous in different cases, for example:

for peripheral pixels of an image sensor structure, which are mainly illuminated by a beam of oblique incidence;

for all the pixels of an image sensor, for example, in the case where this sensor is illuminated most of the time by a beam of oblique incidence;

when the photogenerated charge collection area is not centered in the pixel, the focusing structure is shifted so that incident beams properly reach the central portion of the photodetection area.

This modification of the incident light beam focusing structure enables modulating the main incident beam focusing location. It should be noted that shifted focusing structure 42' may be provided on a portion only of the pixels of the image sensor or all over it, according to the desired use of the sensor.

Figure 8C:
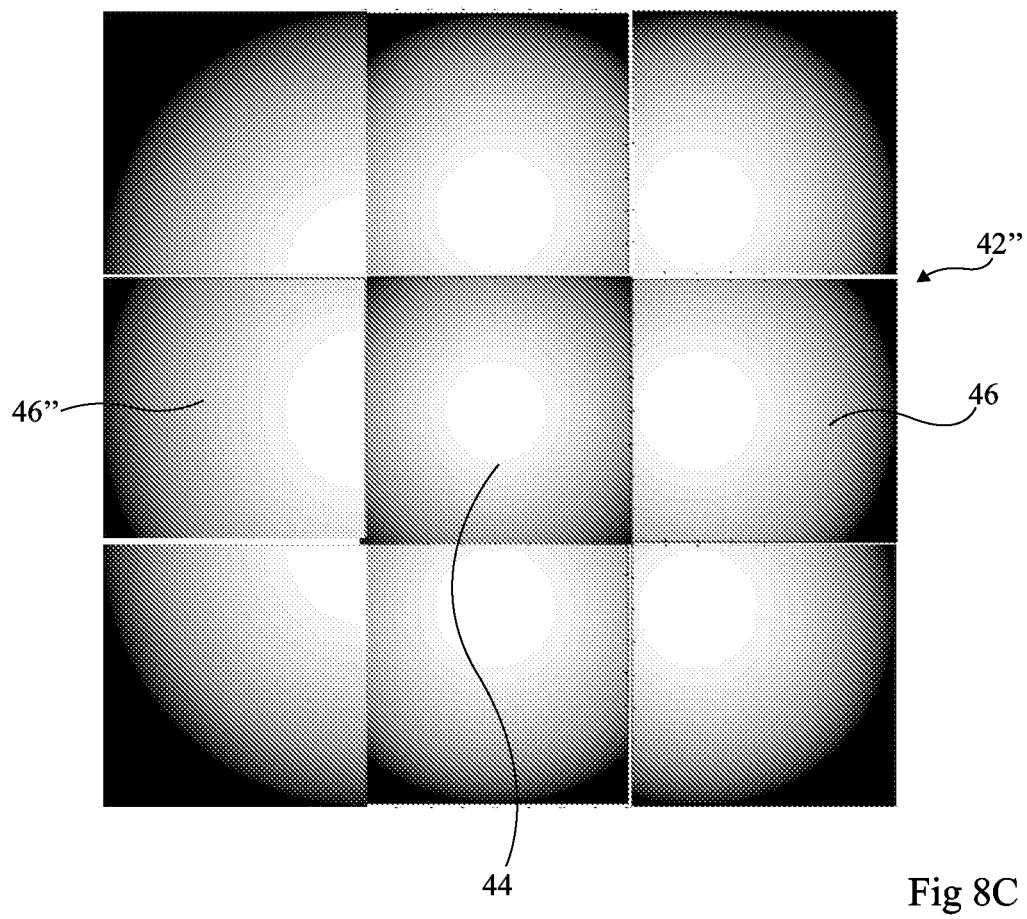

FIG. 8A shows the structure of FIG. 6B under a same illumination and FIGS. 8B and 8C illustrate, respectively, a cross-section view of a structure according to an alternative embodiment and a top view of such an alternative embodiment in grey levels.

In FIG. 8B, focusing structure 42", according to an alternative embodiment, differs from the focusing structure of FIG. 8A in that one or several microlenses 46" of focusing structure 42" has a shape implying a focusing cone modified with respect to the other microlenses 46 of the structure. This enables modifying the inclination of the main axis and the width of the focusing cone of the different microlenses, for example, to avoid that it crosses a portion of the conductive regions of the interconnection stack which would be located above collection area 32. A structure such as shown in FIG. 8B may also be used, for example, for peripheral pixels of the structure, for which some incident light beams are desired to be refocused differently from others.

FIG. 8C illustrates, in top view and in grey levels, the thickness of microlenses 44, 46, and 46" of a focusing structure 42" (light regions correspond to thick microlens regions and dark regions to thin regions of the microlenses). In the example of FIG. 8C, the three microlenses formed on the left-hand portion of the focusing structure are not symmetrical to the microlenses formed on the right-hand portion of this structure. Beams arriving on the different microlenses of structure 42" are thus deviated differently.

The variations of structures 5B, 7B, and 8B may be used in combination or separately on different types of image sensors, according to the pixel layout on the image sensor.

It should be noted that different focusing structures may also be provided, for example, by using microlenses of different thicknesses and of variable deformation, according to the pixel color in the case of color pixels (focusing the incident beams more or less deeply according to the color to be detected).

It should also be noted that the focusing structure with several microlenses discussed herein may be used on image sensor pixels of large pitch as well as of low pitch, if desired.

Figure 9:
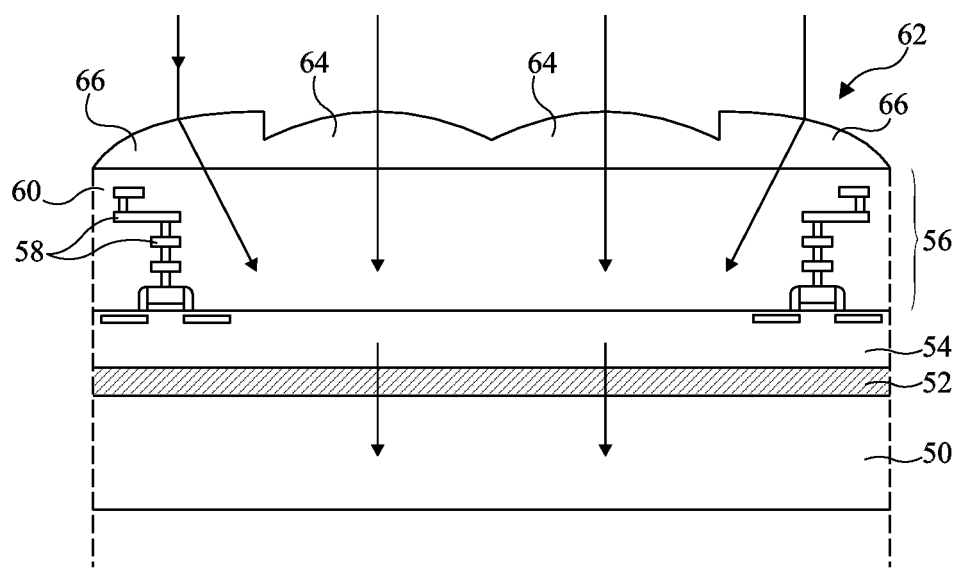
FIG. 9 illustrates an example of a pixel of a liquid crystal display projector according to an embodiment.

FIG. 9 illustrates another application of focusing structures comprising a microlens assembly. This drawing very schematically shows a portion of a liquid crystal display projector (for example, a micro-projector or an LCD), for example, a pixel of such a projector.

This structure is formed of a liquid crystal layer 50 topped with a first conductive electrode 52 of the projector, the second electrode is not shown. On electrode 52 is formed a semiconductor substrate 54 having active electronic components (for example, MOS transistors) provided at its surface, that enables controlling the electrodes of the liquid crystal display projector.

At the surface of semiconductor substrate 54 is formed an interconnection stack 56 comprising conductive tracks and vias 58 separated by an insulating material 60. Such tracks and vias connect the active components formed at the substrate surface together and to the outside of the circuit.

At the surface of interconnection stack 56 is provided a focusing structure 62 comprising a microlens assembly 64, 66. In the shown example, a first part 64 of the microlenses is provided in front of areas having no active components (at the center of FIG. 9). This portion contains thin symmetrical spherical microlenses, for example, only slightly modifying the trajectory of incident light beams. It should be noted that this portion may also not be covered with microlenses.

In front of the areas comprising active electronic components are formed microlenses 66 different from microlenses 64, having their focusing cone provided to deviate incident beams towards areas having no electronic components (at the center of the drawing). This enables avoiding parasitic reflections of light beams which would reach the surface of conductive tracks and vias 58 of interconnection stack 56 as well as critical areas of the transistors.

Thus, advantageously, all the light beams reaching the surface of the microlenses reaches a region of substrate 54 without causing any parasitic reflection, and thus reaches liquid crystal layer 50. A focusing structure such as structure 62 may, for example, be provided for each pixel of a liquid crystal display projector (elementary image display device) to deviate incident beams from the various active elements and conductive tracks and vias of the each of the projector pixels.

Specific embodiments have been described. Various alterations, modifications, and improvements will occur to those skilled in the art. In particular, although focusing structures comprising nine microlenses have been discussed herein, it may also be provided to form focusing structures, in association with image acquisition or display elements, comprising a different number of microlenses.

Various embodiments with different variations have been described hereabove. It should be noted that those skilled in the art may combine various elements of these various embodiments and variations. Thus, elementary structures of the different variations discussed herein may be formed on a same image acquisition or display structure. It may also be provided to combine several variations discussed herein in a same elementary structure, for example, by combining a shifting of the focusing structure such as described in relation with FIG. 7B with a deformed structure such as described in relation with FIG. 8B if necessary, for an image sensor, but also for a pixel of a liquid crystal display projector.

It may also be provided to adapt the elementary image acquisition or display structures discussed herein to any optical system requiring deviating light beams from a trajectory crossing elements capable of reflecting these beams, and especially to back-side illuminated image sensors, for example, to decrease crosstalk phenomena.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An elementary image acquisition or display device, comprising: a plurality of pixels, each pixel including a focusing structure that includes: a collection area; and a plurality of microlenses that are located adjacent to and abutting one another, and each microlens having a spherical shape and a serrated upper surface relative to an adjacent microlens, each microlens being shaped to focus incident light beams towards the collection area while avoiding intermediate conductive tracks and vias.

2. The elementary device of claim 1, wherein the focusing structure comprises an array of at least nine microlenses.

3. The elementary device of claim 1, wherein the focusing structure comprises a first portion in which at least one microlens is spherical and symmetrical and a second portion in which two or more microlenses are curved.

4. The elementary device of claim 1, wherein the intermediate conductive tracks and vias are separated by an insulating material to form an interconnection stack, the microlenses being formed at a surface of the interconnection stack.

5. An image sensor comprising at least one elementary image acquisition device of claim 1, wherein the microlenses of the focusing structure are configured to focus incident light beams towards the portion of the collection area, and wherein the collection area is configured to collect photogenerated charges.

6. The sensor of claim 5, wherein each of the at least one elementary image acquisition devices has, at a surface of the substrate, dimensions greater than 0.8 times an interval separating the microlenses from the substrate.

7. The sensor of claim 5, wherein the at least one elementary image acquisition device comprises an array of elementary image acquisition devices, and wherein focusing structures of the respective elementary image acquisition devices have different shapes.

8. The sensor of claim 5, comprising a first elementary image acquisition device in which a first focusing structure is centered above a corresponding first photogenerated charge collection area, and a second elementary image acquisition device in which a second focusing structure is off-centered above a corresponding second photogenerated charge collection area.

9. A liquid crystal display projector comprising at least one elementary image display device of claim 1, the liquid crystal display projector further comprising, above the collection area and opposite to the microlenses, a liquid crystal layer, the microlenses of the focusing structure being configured to focus incident light beams towards said liquid crystal layer.

10. The elementary device of claim 1, wherein the microlenses include at least one centrally-disposed microlens and two or more peripherally-disposed microlenses, the peripherally-disposed microlenses being disposed around a periphery of the at least one centrally-disposed microlens, wherein a shape of a first of the peripherally-disposed microlenses differs from a shape of a second of the peripherally-disposed microlenses.

11. The elementary device of claim 10, wherein a shape of a focusing cone of the first peripherally-disposed microlens differs from a shape of a focusing cone of the second peripherally-disposed microlenses.

12. The device of claim 10, wherein the peripherally-disposed microlenses have a plurality of non-uniform thicknesses at a respective plurality of points equidistant from a center of the at least one centrally-disposed microlens.

13. A device comprising: a substrate; a pixel array, each pixel including a light-transmitting structure, a portion of the substrate, and an interconnect layer disposed between the light-transmitting structure and the portion of the substrate, wherein each of the interconnect layers comprises at least one of conductive traces and vias, wherein each of the light-transmitting structures comprises a plurality of microlenses configured to transmit incident light to the respective portion of the substrate, the plurality of microlenses having convex upper surfaces, the plurality of microlenses including at least one centrally-disposed microlens and two or more peripherally-disposed microlenses, the peripherally-disposed microlenses being disposed adjacent to and abutting the at least one centrally-disposed microlens, wherein the at least one centrally-disposed microlens has a single first radius of curvature and the peripherally-disposed microlenses have a single second radius of curvature that is different from the first radius of curvature.

14. The device of claim 13, wherein a shape of a focusing cone of the first peripherally-disposed microlens differs from a shape of a focusing cone of the second peripherally-disposed microlens.

15. The device of claim 13, wherein the peripherally-disposed microlenses have a plurality of non-uniform thicknesses at a respective plurality of points equidistant from a center of the at least one centrally-disposed microlens.

16. The device of claim 13, wherein each of the light-transmitting structures comprises an array of at least nine microlenses, the array of at least nine microlenses including the at least one centrally-disposed microlens and the peripherally-disposed microlenses.

17. The device of claim 13, wherein the at least one centrally-disposed microlens is spherical and symmetrical, and wherein the peripherally-disposed microlenses are curved.

18. The device of claim 13, wherein at least one of the conductive tracks and vias are separated by an insulating material to form an interconnection stack, the plurality of microlenses being formed at a surface of the interconnection stack.

19. The device of claim 13, wherein the device is an image acquisition device, and wherein the microlenses of the light-transmitting structure are configured to transmit incident light to an area of the substrate, the area configured to collect photogenerated charges.

20. The device of claim 13, wherein a pitch of each of the pixels is at least 0.8 times a shortest distance between the microlenses of the light-transmitting structure and the first portion of the substrate.

21. The device of claim 13, wherein: a first set of the plurality of microlenses of each light-transmitting structure are configured to transmit incident beams of a first color to a first area of the substrate configured to collect photogenerated charges; a second set of the plurality of microlenses are configured to transmit incident light of a second color to a second area of the substrate configured to collect photogenerated charges; and differences between at least one of shapes and thicknesses of corresponding microlenses of the first and second sets depend on the first and second colors.

22. The device of claim 13, wherein: each of the light-transmitting structures is a first light-transmitting structure, the first light-transmitting structure is configured to transmit incident beams to a first area of the substrate configured to collect photogenerated charges, and the first light-transmitting structure is centered above the first charge-collection area of the substrate; and the device further includes a second light-transmitting structure configured to transmit incident light to a second area of the substrate configured to collect photogenerated charges, and the second light-transmitting structure is off-centered above the second charge-collection area of the substrate.

23. The device of claim 13, wherein the device is an image display device, wherein the image display device further comprises a display layer above the substrate and opposite to the microlenses of the light-transmitting structure, and wherein the microlenses of the focusing structure are configured to transmit incident light toward the display layer.

24. The elementary device of claim 1, wherein the shape of the microlens of the focusing structure depends on the color detected by the portion of the substrate corresponding to the focusing structure.

25. The elementary device of claim 1, wherein the thickness of the microlens of the focusing structure depends on the color detected by the portion of the substrate corresponding to the focusing structure.

26. The elementary device of claim 1, wherein at least one of a shape and a thickness of one of the microlenses of the focusing structure depends on a color detected by the portion of the substrate corresponding to the focusing structure.

27. The device of claim 13, wherein a shape of a first of the peripherally-disposed microlenses differs from a shape of a second of the peripherally-disposed microlenses.

28. The device of claim 13, wherein the first radius of curvature is smaller than the second radius of curvature.

* * * * *